US005945773A

United States Patent [19]

Nagashima

[11] Patent Number: 5,945,773

[45] Date of Patent: Aug. 31, 1999

[54] PIEZOELECTRIC ACTUATOR FOR INK-JET PRINTER AND METHOD OF MANUFACTURING THE SAME

[75] Inventor: Mitsuyoshi Nagashima, Sayama, Japan

[73] Assignee: Citizen Watch Co., Ltd., Tokyo, Japan

[21] Appl. No.: 08/750,780

[22] PCT Filed: Jun. 21, 1995

[86] PCT No.: PCT/JP95/01236

§ 371 Date: Dec. 20, 1996

§ 102(e) Date: Dec. 20, 1996

[87] PCT Pub. No.: WO96/00151

PCT Pub. Date: Jan. 4, 1996

[30] Foreign Application Priority Data

Jun. 23, 1994 [JP] Japan .................................... 6-141839

[51] Int. Cl.[6] .............................. B41J 2/045; H01L 41/08

[52] U.S. Cl. ............................................ 310/328; 310/365

[58] Field of Search .................................... 310/328, 365, 310/366

[56] References Cited

U.S. PATENT DOCUMENTS

| | | | |
|---|---|---|---|
| 3,461,910 | 8/1969 | Selsam et al. | 310/328 |
| 4,219,755 | 8/1980 | O'Neill et al. | 310/348 |
| 5,175,465 | 12/1992 | Um et al. | 310/328 |

FOREIGN PATENT DOCUMENTS

| | | | |
|---|---|---|---|
| 58-31609 | 2/1983 | Japan | 310/324 |
| 3-9846 | 1/1991 | Japan | B41J 2/045 |
| 3-166952 | 7/1991 | Japan | B41J 2/045 |
| 3-243358 | 10/1991 | Japan | B41J 2/045 |
| 4-1052 | 1/1992 | Japan | B41J 2/045 |
| 4-52213 | 8/1992 | Japan | B41J 3/04 |
| 5-42671 | 2/1993 | Japan | B41J 2/045 |
| 5-198860 | 8/1993 | Japan | H01L 41/09 |
| 6-188474 | 7/1994 | Japan | H01L 41/09 |

*Primary Examiner*—Thomas M. Dougherty
*Attorney, Agent, or Firm*—Armstrong, Westerman, Hattori, McLeland & Naughton

[57] ABSTRACT

Laminated piezoelectric elements (2) are formed by alternately laminating first piezoelectric layers (4) and second piezoelectric layers (5), each of which have the shape of a thin plate. First internal electrodes (4*a*) are formed on a flat surface of each first piezoelectric layer (4) so as to be exposed only on one of the opposite longitudinal end surfaces of the laminated piezoelectric element (2). Second internal electrodes (5*a*) are formed on a flat surface of each second piezoelectric layer (5) so as to be exposed only on the other longitudinal end surface of the laminated piezoelectric element (2). Since the first and the second internal electrodes (4*a*, 5*a*) differ in polarity and are not exposed on the same end surface of each laminated piezoelectric element 2, the first and the second internal electrodes (4*a*, 5*a*) are prevented from short-circuiting due to the adhesion of aqueous ink or moisture to the laminated piezoelectric elements (2).

4 Claims, 8 Drawing Sheets

PIEZOELECTRIC ACTUATOR FOR INK-JET PRINTER AND METHOD OF MANUFACTURING THE SAME

BACKGROUND OF THE INVENTION

1. Field of the Invention

The present invention relates to a piezoelectric actuator suitable for driving an ink-jet head, and a method of manufacturing such a piezoelectric actuator.

2. Description of the Related Art

Ink-jet printers among non-impact printers progressively extending their market in recent years are based on the simplest principle and are suitable for color printing. The so-called drop-on-demand (DOD) ink-jet printers are favorites among ink-jet printers.

A previously proposed ink-jet head for printers of the aforesaid type employs, as a driving source, a laminated piezoelectric actuator formed by alternately laminating piezoelectric layers and electrodes. In this laminated piezoelectric actuator, the piezoelectric layers are distorted when a driving voltage is applied across the electrodes and thereby the volume of an ink chamber adjoining the actuator is changed. The distortion of the piezoelectric actuator increases in proportion to the number of the piezoelectric layers even if the driving voltage is low.

Various efforts have been made to provide an ink-jet head employing a piezoelectric actuator with a plurality of nozzles in a high density in order that a variety of characters can be printed with a high resolution.

For example, a print head disclosed in JP-A No. 4-1052 has an arrangement of piezoelectric elements formed by forming slits at fixed intervals in a sintered, laminated piezoelectric plate. The piezoelectric elements are distorted in directions perpendicular to the direction of polarization, i.e., in a mode corresponding to the piezoelectric strain constant d31, to control the pressure in a pressure chamber adjoining the piezoelectric element.

An ink-jet head disclosed in JP-B No. 4-52213 forms a piezoelectric element on a first electrode formed on one of the opposite sides of a wall defining an ink chamber and forms a second electrode on the other side of the wall for high-level integration and facilitating electrical connection of electrodes to the piezoelectric element.

In the prior art print head disclosed in JP-A No. 4-1052, however, the alternately arranged electrodes of different polarities are exposed on the cut surfaces of the piezoelectric elements formed by slitting the laminated piezoelectric plate. Therefore, there is the possibility that the electrodes are short-circuited by aqueous ink adhering to the cut surfaces or by moisture contained in the atmosphere and adhering to the cut surfaces of the piezoelectric elements.

Generally, the thickness of the piezoelectric layers is as small as about 0.02 mm and the thickness of the electrodes is as small as about 0.002 mm. Therefore, the electrodes are arranged at very small intervals. Moreover, the piezoelectric layers are compressed by a machining pressure applied to the piezoelectric plate when forming the piezoelectric elements and the thickness of the piezoelectric layers is further reduced. Consequently, there is the possibility that the intervals between the electrodes are reduced and the electrodes are short-circuited during manufacture.

In the prior art ink-jet head disclosed in JP-B 4-52213, the first and the second electrodes for electrically connecting the piezoelectric element are formed on the opposite sides of the piezoelectric element and are not included in a plane.

Therefore, a complicated connecting structure is required for connecting the electrodes to an external circuit, which increases mounting cost and the size of the head is inevitably large.

When laminated piezoelectric elements are employed, the electrodes are exposed on cut surfaces similarly to those of the former ink-jet head and, therefore, there is the possibility that the adjacent electrodes are short-circuited.

SUMMARY OF THE INVENTION

A piezoelectric actuator for an ink-jet printer, in accordance with the present invention, solves the problems in the prior art and is characterized by electrodes capable of being easily connected to an external circuit and which are free from the danger of short-circuiting.

A plurality of laminated piezoelectric elements each formed by alternately laminating first piezoelectric layers and second piezoelectric layers having the shape of a thin plate are mounted and transversely arranged at fixed intervals on a base.

A first internal electrode is formed on a flat surface of each first piezoelectric layer so as to be exposed only at one of the opposite longitudinal ends of the laminated piezoelectric element, and a second internal electrode is formed on a flat surface of each second piezoelectric layer so as to be exposed only to the other longitudinal ends of the laminated piezoelectric element.

Common electrodes are formed on the base and electrically connected by a collective conductive means to the exposed ends of the first internal electrodes of the piezoelectric elements. Individual electrodes are formed on the base, the number of which being equal to that of the laminated piezoelectric elements, and each of the individual electrodes is connected electrically by an individual conductive means to the exposed ends of the second internal electrodes of each laminated piezoelectric element.

In the piezoelectric actuator for an ink-jet head thus constructed, the respective ends of the first and the second internal electrodes of each laminated piezoelectric element are not exposed on the same end surface of the laminated piezoelectric element. Therefore, the first and the second internal electrodes of different polarities are isolated from each other with high reliability and hence there is little possibility that the electrodes are short-circuited even if aqueous ink or moisture contained in the atmosphere adheres to the laminated piezoelectric elements.

When the common electrodes and the individual electrodes are formed on the same surface of the base, these electrodes can easily be connected to an external circuit by a flexible printed cable or the like.

The collective, conductive means may be a metal thin film continuously formed on the surface of the base and one of the end surfaces of each laminated piezoelectric element so as to be connected to the common electrodes. The individual conductive means may be a portion of a metal thin film formed continuously on the other end surface of each laminated piezoelectric element so as to be connected to the individual electrodes.

A piezoelectric actuator manufacturing method in accordance with the present invention is capable of manufacturing the foregoing piezoelectric actuator at a low cost and a high yield.

The piezoelectric actuator manufacturing method in accordance with the present invention has the following steps.

First, a plurality of internal electrodes of a width narrower than that of the laminated piezoelectric elements to be formed are formed on a surface of each of the first piezoelectric substrates with their center axes aligned with those of the piezoelectric elements so that only one of the end edges of each internal electrode reaches the longitudinal end edge of the first piezoelectric substrate.

Then, a plurality of internal electrodes of a width narrower than that of the laminated piezoelectric elements are formed on a surface of each of the second piezoelectric substrates with their center axes aligned with those of the laminated piezoelectric elements so that only one of the end edges of each internal electrode reaches the longitudinal end edge of the second piezoelectric substrate.

Subsequently, the first and the second piezoelectric substrates are stacked alternately to construct a laminated piezoelectric block.

The laminated piezoelectric block thus constructed is bonded to a base at a predetermined position, and a thin metal film is formed over the surfaces of the base and the piezoelectric block.

Then, longitudinal portions of a fixed width of the laminated piezoelectric block between the adjacent internal electrodes are cut out to form a plurality of laminated piezoelectric elements. The thin metal film formed in an electrode forming region on the base is divided into a common electrode and a plurality of individual electrodes.

The common electrode is connected electrically to the thin metal films each formed on one of the longitudinal end surfaces of each laminated piezoelectric element. The individual electrodes are connected electrically to the thin metal films formed on the other longitudinal end surfaces of the laminated piezoelectric elements. Preferably, the common electrodes and the individual electrodes are arranged transversely in the electrode forming region on the base.

When forming the thin metal film on the surfaces of the base and the laminated piezoelectric block by the foregoing piezoelectric electric actuator manufacturing method, it is preferable to leave a region in which the thin metal film is not formed in the surface of the laminated piezoelectric block so that at least a portion of the uppermost internal electrode is exposed.

Positions of the longitudinal portions to be cut out of the laminated piezoelectric block can properly be determined with reference to the position of the exposed portion of the uppermost internal electrode, and the longitudinal portions of the laminated piezoelectric block can properly be cut out, which facilitates the manufacture of the piezoelectric actuator.

DETAILED DESCRIPTION OF THE PREFERRED EMBODIMENTS

Preferred embodiments of the present invention will be described hereinafter with reference to the accompanying drawings.

Figure 1:
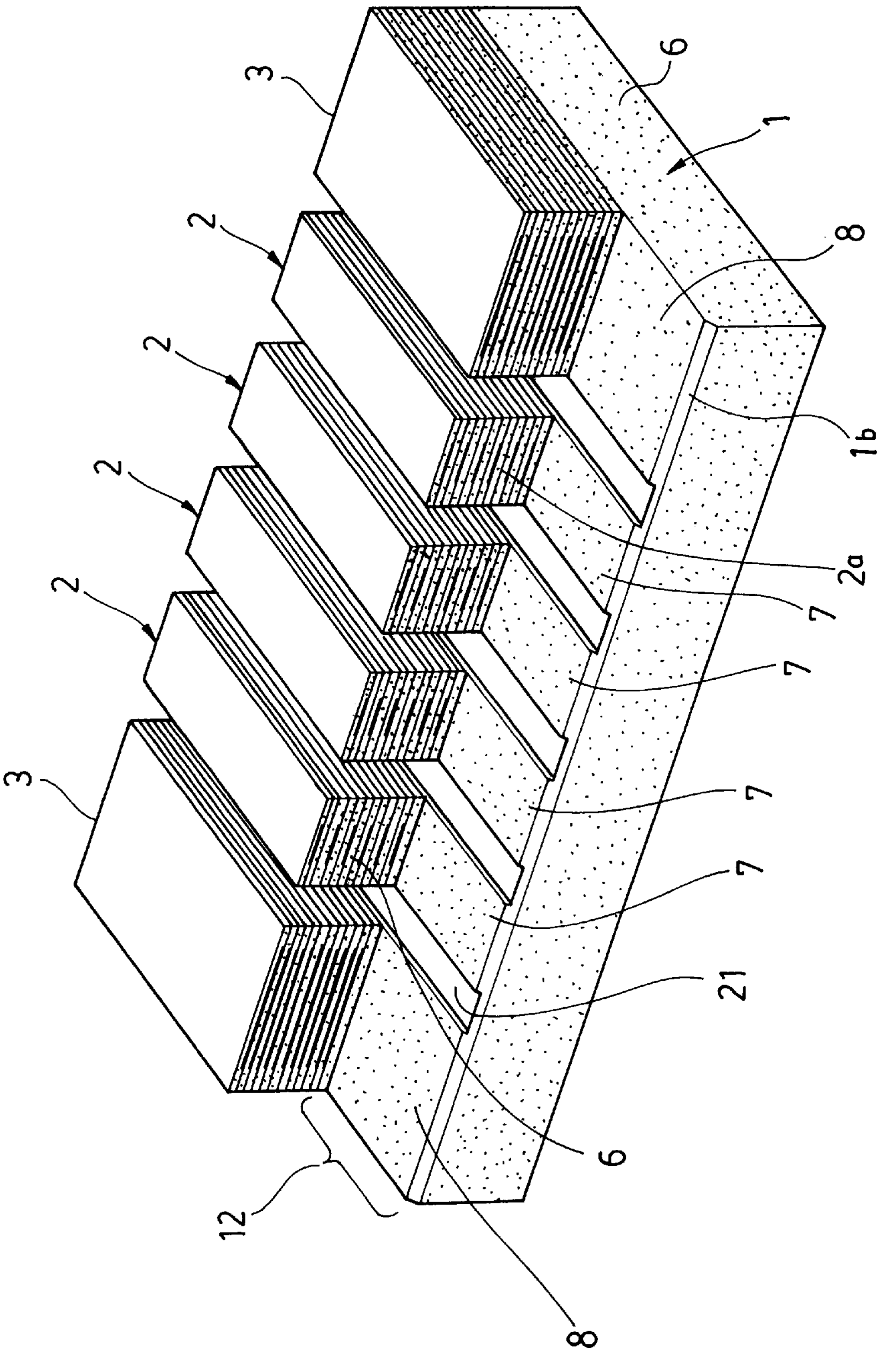
FIG. 1 is a perspective view of a piezoelectric actuator for an ink-jet printer, in a preferred embodiment according to the present invention taken from the back side of the piezoelectric actuator.
Figure 2:
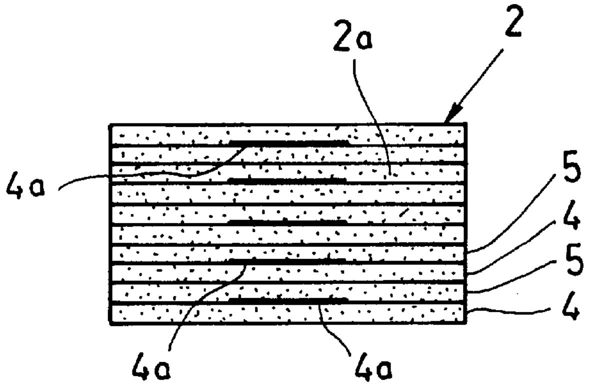
FIGS. 2 is a front view of a laminated piezoelectric element included in the piezoelectric actuator of FIG. 1.
Figure 3:
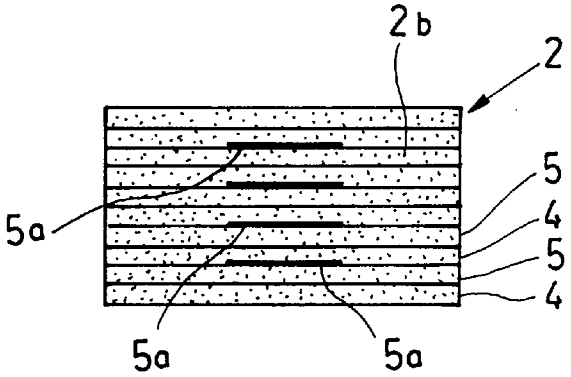
FIG. 3 is a rear view of the laminated piezoelectric element of FIG. 2.
Figure 4:
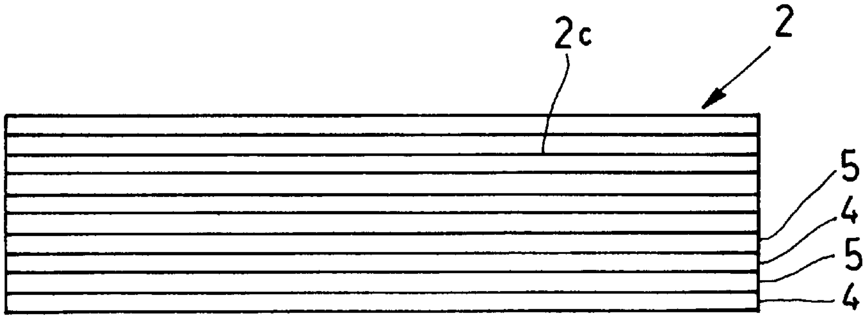
FIG. 4 is a side view of the laminated piezoelectric element of FIG. 2.

FIG. 1 is a perspective view of a piezoelectric actuator for an ink-jet printer, in a preferred exemplary embodiment according to the present invention for an ink-jet head. FIGS. 2, 3 and 4 are a front view, a rear view and a side view, respectively, of a laminated piezoelectric element included in the piezoelectric actuator of FIG. 1.

A plurality of laminated piezoelectric elements 2 are arranged transversely at fixed intervals on the upper surface of a base 1 of a ceramic material having the shape of a rectangular plate, and columns 3 are disposed on the opposite sides of the arrangement of the laminated piezoelectric elements 2. The front end surfaces of the laminated piezoelectric elements 2 and the columns 3 are flush with the front end surface of the base 1.

As shown in FIGS. 2 to 4, each laminated piezoelectric element 2 is formed by alternately laminating first piezoelectric layers 4 and second piezoelectric layers 5 of the shape of a thin plate. The piezoelectric layers have a piezoelectric strain constant d33 and are distorted in the direction of thickness (direction of polarization) when a voltage is applied thereto.

First internal electrodes 4*a* are formed on a flat surface of each first piezoelectric layer 4, and second internal electrodes 5*a* are formed on a flat surface of each second piezoelectric layer 5.

The first internal electrodes 4*a* are formed in a fixed width and extend within the laminated piezoelectric element 2. The front ends of the first internal electrodes 4*a* are exposed on the front end surface 2*a* of the laminated piezoelectric element 2, and the first internal electrodes 4*a* are not exposed on other surfaces (back end surfaces 2*b* and opposite side surfaces 2*c*) of the laminated piezoelectric element 2. The second internal electrodes 5*a* are formed in a fixed width and extend within the laminated piezoelectric element 2. The back ends of the second internal electrodes 5*a* are exposed to the back end surface 2*b* of the laminated piezoelectric element 2 and the second internal electrodes 5 are not exposed to other surfaces (front end surfaces 2*a* and opposite side surfaces 2*c*) of the laminated piezoelectric element 2.

A thin metal film 6 is formed on the back end surface 2*b* of the laminated piezoelectric element 2. The second internal electrodes 5*a* are electrically connected to the thin metal film 6 (individual conductive means).

Individual electrodes 7 are formed in portions of the upper surface of the base 1, on which the laminated piezoelectric elements 2 are mounted, extending behind the laminated piezoelectric elements 2 so as to correspond to the respective laminated piezoelectric elements 2. The individual electrodes 7 are isolated from each other. The individual electrodes 7 are connected electrically to the thin metal films 6 (collective conductive means) formed on the respective back end surfaces 2*b* of the laminated piezoelectric elements 2.

Common electrodes 8 are formed in portions of the upper surface of the base 1 extending behind the columns 3, and thin metal films are formed on the back end surfaces of the columns 3. The thin metal films on the back end surfaces of the columns 3 are not necessary.

Figure 5:
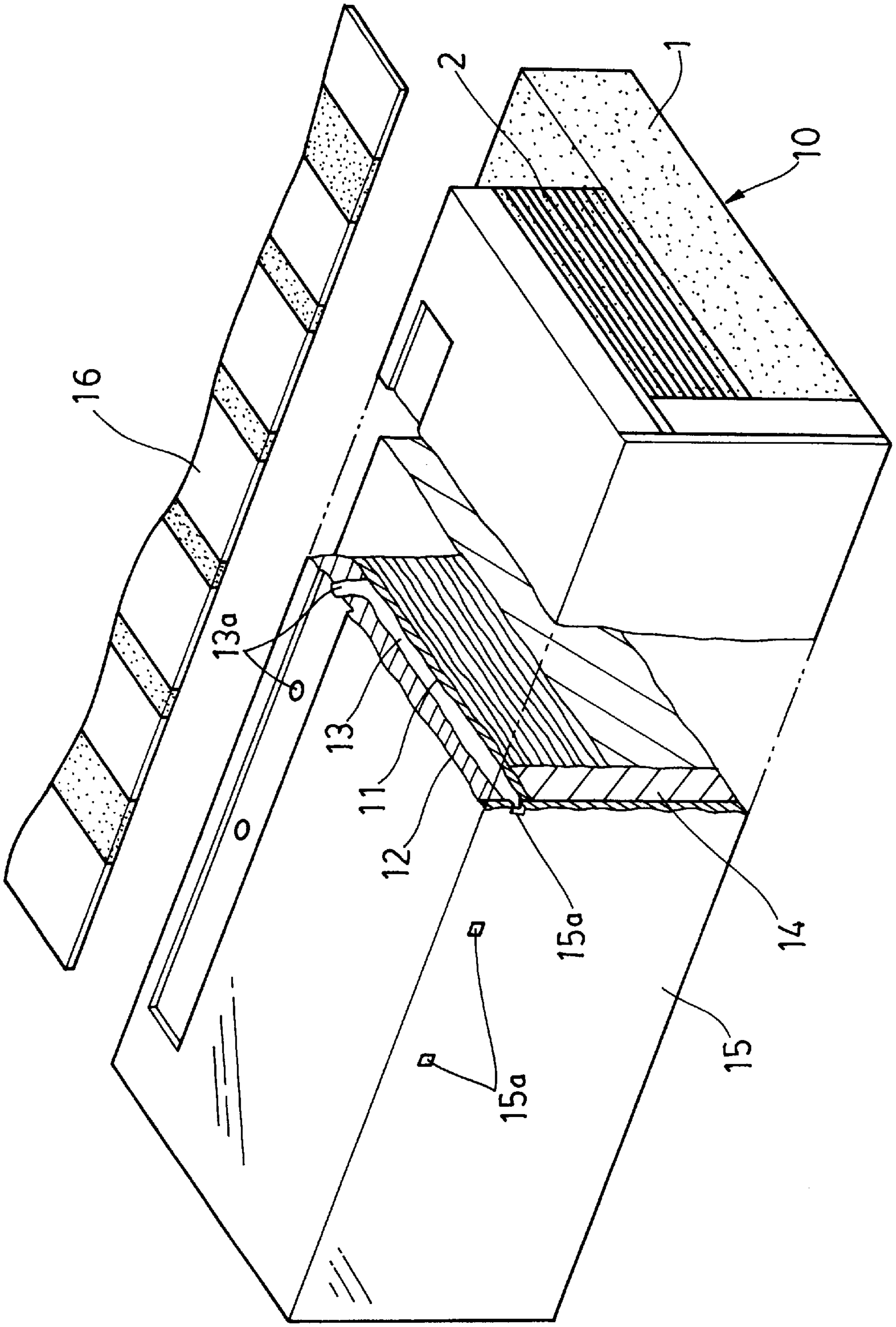
FIG. 5 is a partly cutaway perspective view of an ink-jet head provided with a piezoelectric actuator embodying the present invention.

Since the individual electrodes 7 and the common electrodes 8 are arranged in a back portion of the upper surface of the base 1, the individual electrodes 7 and the common electrodes 8 can easily be connected to an external circuit by a flexible print cable 16 (refer to FIG. 5).

Thin metal films 6 are formed on the front end surfaces 2*a* of the laminated piezoelectric elements 2, and the front end surface and the opposite side surfaces of the base 1 to connect electrically the first internal electrodes 4*a* of the laminated piezoelectric elements 2 to the common electrodes 7.

FIG. 5 is a partly cutaway perspective view of an ink-jet head provided with this piezoelectric actuator.

This ink-jet head has ink chambers 13 which are to be deformed by the foregoing piezoelectric actuator 10 having a piezoelectric strain constant d33 embodying the present invention. As thin oscillation plate 11 is bonded to the upper surface of the piezoelectric actuator 10, and a flow passage member 12 is bonded to the upper surface of the oscillation plate 11. The ink chambers 13 are formed at fixed intervals in the flow passage member 12 so as to face the piezoelectric actuator 10 through the oscillation plate 11. Ink supply openings 13*a* are connected to the ink chambers 13, and ink cartridges, not shown, i.e., ink sources, are connected to the respective ink supply openings 13*a*.

A front plate 14 is attached to the front end surface of the piezoelectric actuator 10. The front surface of the front plate 14 and the respective front end surfaces of the oscillation plate 11 and the flow passage member 12 are flush with each other. A nozzle plate 15 provided with nozzle holes 15*a* is attached to the front surface of the front plate 14 and the respective front end surfaces of the oscillation plate 11 and the flow passage member 12 so that the respective nozzle holes 15*a* are connected to the ink chambers 13.

A flexible print cable 16 is connected to the individual electrodes 7 and the common electrodes 8 of the piezoelectric actuator 10. A voltage is applied through the flexible printed cable 16 to the individual electrodes 7 and the common electrodes 8; consequently, a potential difference is created between the first internal electrodes 4*a* and the second internal electrodes 5*a*, whereby the first piezoelectric layers 4 and the second piezoelectric layers 5 sandwiched between the internal electrodes 4*a* and 5*a* are distorted in the direction of the thickness.

Consequently, the oscillation plate 11 is distorted to change the volumes of the ink chambers 13 and thereby the ink contained in the ink chambers 13 is jetted through the nozzle holes 15*a*.

Since the first internal electrodes 4*a* and the second internal electrodes 5*a* of the piezoelectric actuator 10 are exposed on the different end surfaces of each laminated piezoelectric element, the internal electrodes 4*a* and 5*a* are not short-circuited even if the piezoelectric actuator 10 is wetted or moistened with aqueous ink or moisture contained in the atmosphere.

A method of manufacturing the foregoing piezoelectric actuator will be described with reference to FIGS. 1 and 6 to 10.

Figure 7:
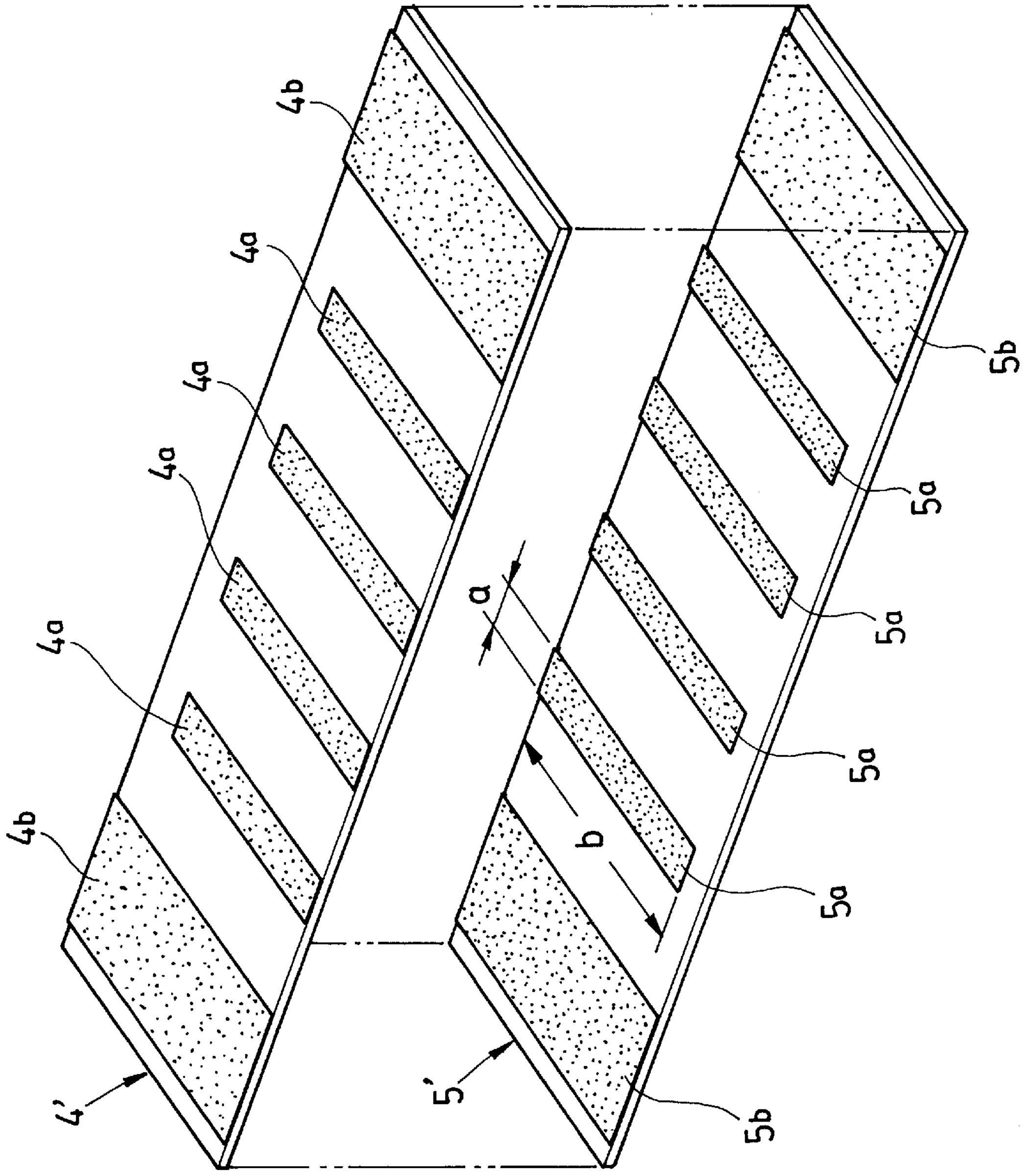
FIG. 7 is a perspective view of a first piezoelectric substrate and a second piezoelectric substrate to be fabricated first by the piezoelectric actuator manufacturing method of the present invention.

First, referring to FIG. 7, the first internal electrodes 4*a* and end electrodes 4*b* are formed on flat surfaces of first piezoelectric substrates 4' having a piezoelectric strain constant d33. These electrodes may be formed by a known means, such as sputtering or vacuum evaporation. The first piezoelectric substrates 4' have a width approximately equal to the width of the base (FIG. 1) and a length approximately equal to the length of the laminated piezoelectric elements 2.

The first internal electrodes 4*a* have a width a narrower than that of the laminated piezoelectric elements 2 (FIG. 1) and a length b shorter than that of the laminated piezoelectric elements 2. The first internal electrodes 4*a* are formed so that the longitudinal axes thereof are aligned with those of the respective laminated piezoelectric elements 2 mounted on the base 1. One of the longitudinal ends of each first internal electrode 4*a* coincides with the edge of the front end surface 2*a* of the corresponding laminated piezoelectric element 2.

The end electrodes 4*b* may be formed with an optional width in the transverse opposite end portions of the surface of the first piezoelectric substrates 4'. The end electrodes 4*b* are formed to obtain a laminated block of a uniform height by laminating the first piezoelectric substrates 4' and second piezoelectric substrates 5', which will be described below.

As shown in FIG. 7, the second internal electrodes 5*a* and end electrodes 5*b* are formed on flat surfaces of the second piezoelectric substrates 5' having a piezoelectric strain constant d33. The materials and dimensions of the second piezoelectric substrates 5', the second internal electrodes 5*a* and the end electrodes 5*b* are the same as those of the first piezoelectric substrates 4', the first internal electrodes 4*a* and the end electrodes 4*b*, and methods of forming the same are the same as those of forming the first piezoelectric substrates 4', the first internal electrodes 4*a* and the end electrodes 4*b*.

The second internal electrodes 5*a* differ from the first internal electrodes 4*a* in that one of the longitudinal ends of each of the second internal electrodes 5*a* coincides with the edge of the back end surface 2*b* of the corresponding laminated piezoelectric element 2.

Figure 6:
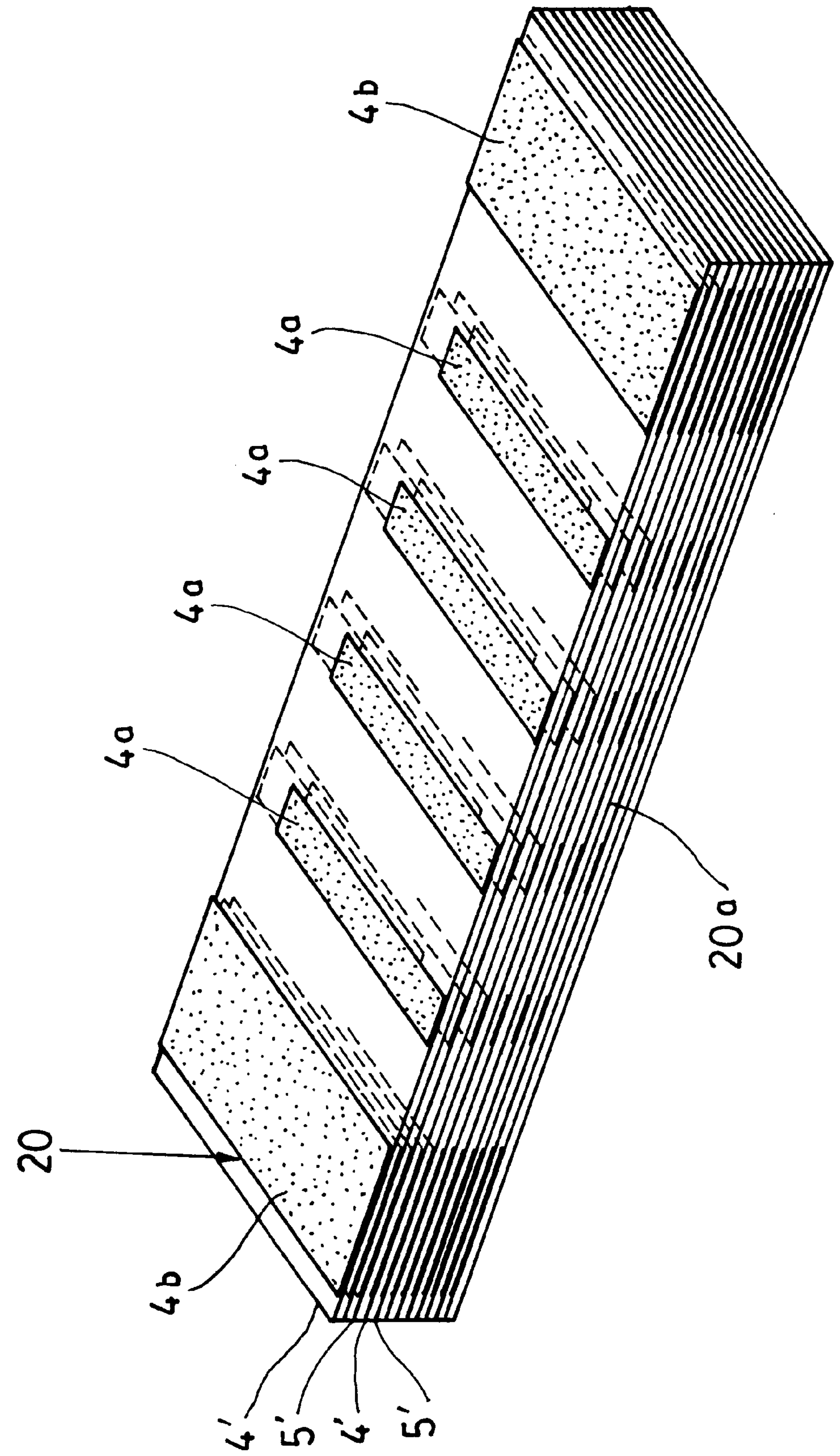
FIG. 6 is a perspective view of a laminated piezoelectric block in a process of a piezoelectric actuator manufacturing method embodying the present invention.

Referring now to FIG. 6, the first piezoelectric substrates 4' and the second piezoelectric substrates 5' are stacked alternately, and the first piezoelectric substrates 4' and the second piezoelectric substrates 5' are bonded together by sintering or the like to obtain the laminated piezoelectric block 20. The first internal electrodes 4*a* are exposed on the front end surface 20*a* of the laminated piezoelectric block 20, and the second internal electrodes 5*a* are exposed on the back end surface of the laminated piezoelectric block 20.

Figure 8:
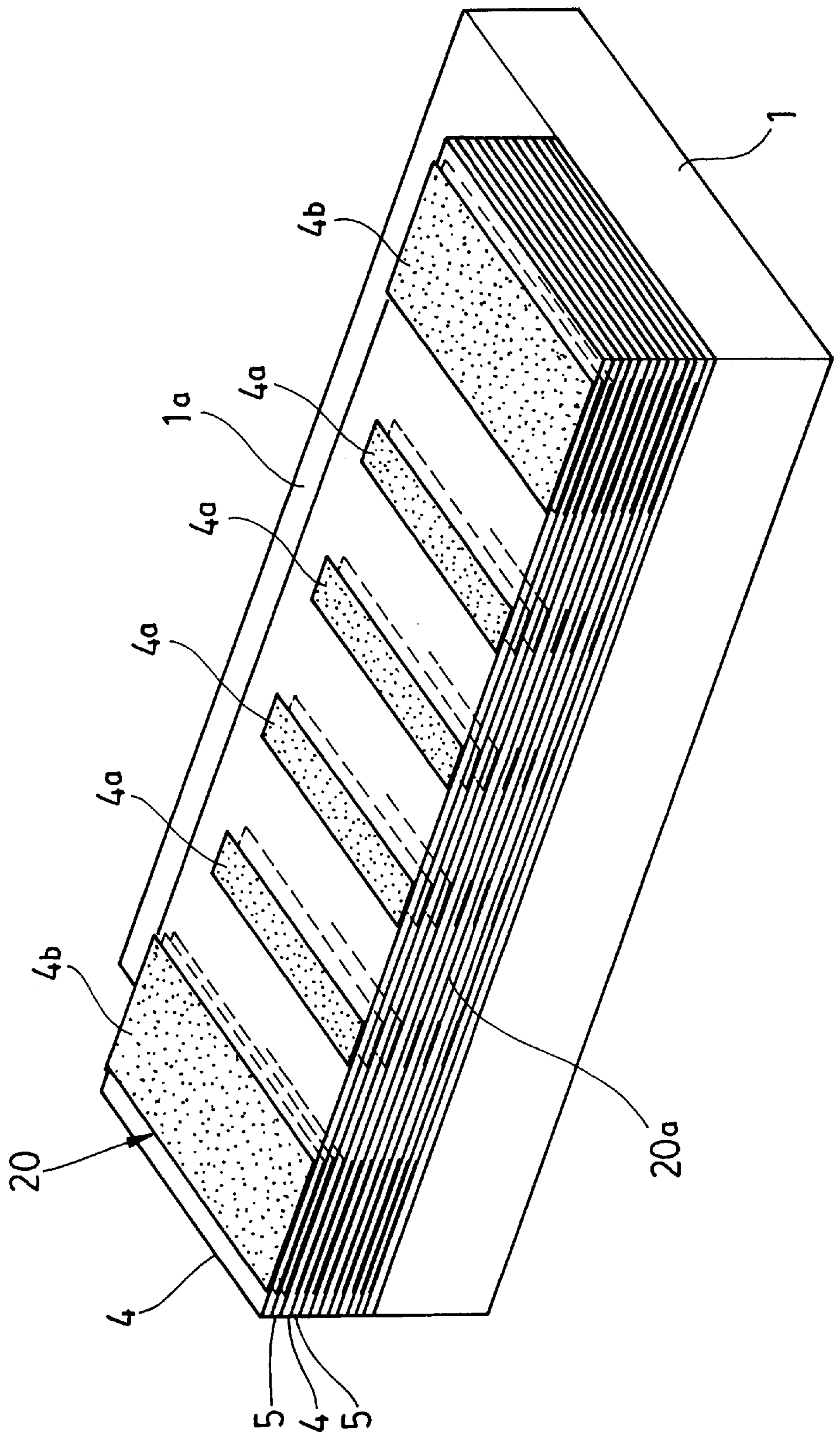
FIG. 8 is a perspective view of a laminated piezoelectric block as bonded to a base in a process of the piezoelectric actuator manufacturing method of the present invention.

The laminated piezoelectric block 20 is bonded to the upper surface of the ceramic base 1 as shown in FIG. 8 with its front surface 20*a* flush with the front end surface of the base 1. The length of the base 1 is greater than that of the laminated piezoelectric block 20. Thus, the base 1 has a flat surface of a fixed length in a back portion of its upper surface. This flat surface is used as an electrode support surface 1*a*.

Figure 9:
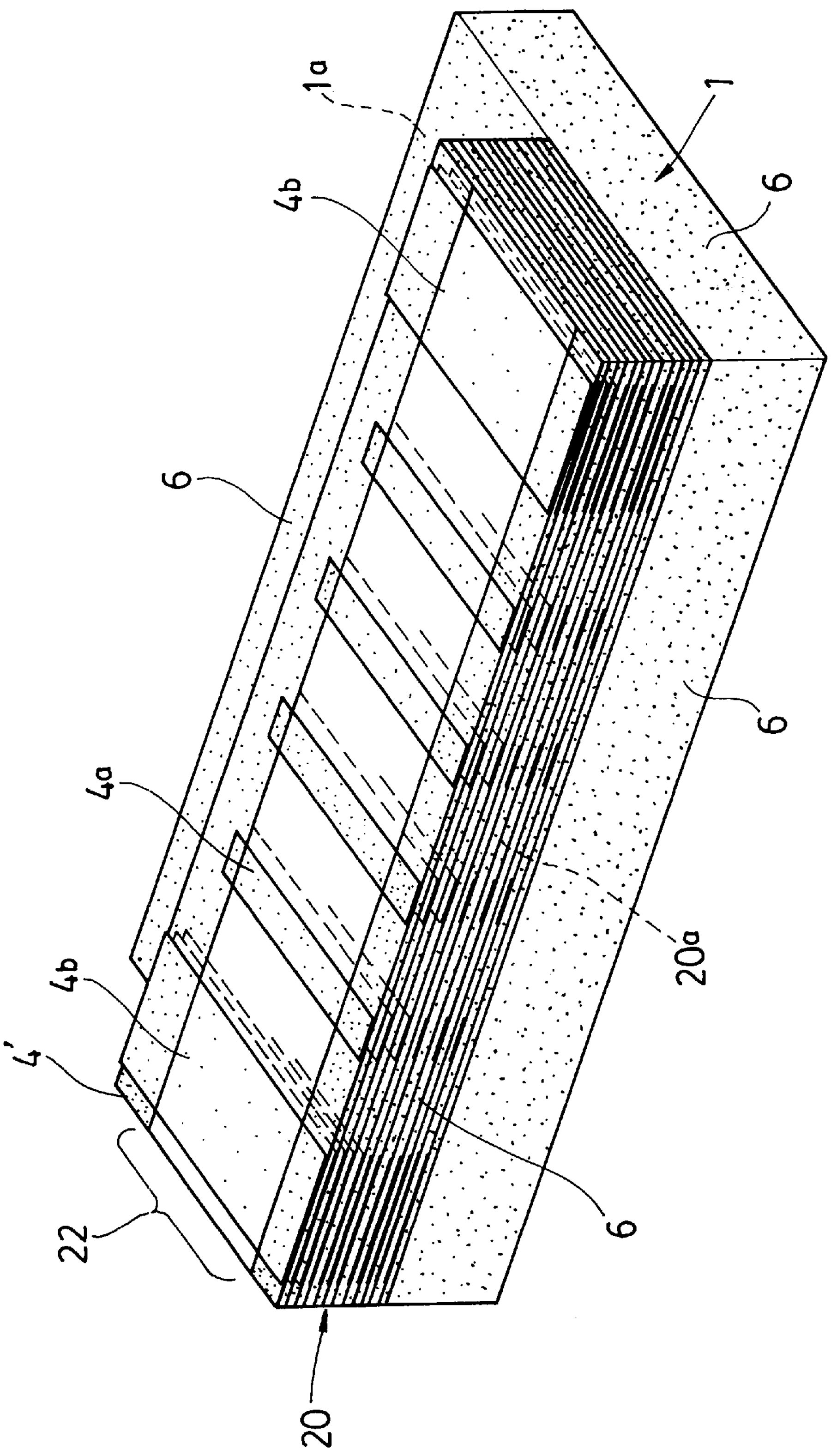
FIG. 9 is a perspective view of the base and the laminated piezoelectric block coated with a thin metal film in a process of the piezoelectric actuator manufacturing method of the present invention.

Referring to FIG. 9, the entire surface of a structure formed by bonding together the base 1 and the laminated piezoelectric block 20 is coated with a thin metal film 6 of a metal, such as gold, by a metallizing process, such as sputtering or vacuum evaporation.

The arrangement of the internal electrodes (the first internal electrodes 4*a* in FIG. 9) and the end electrodes (end electrodes 4*b* in FIG. 9) formed on the top surface of the laminated piezoelectric block 20 is used as a dummy pattern, and the electrodes 4*a* and 4*b* are masked with a mask when forming the thin metal film 6. When the mask is removed after forming the thin metal film 6, the arrangement of the electrodes 4*a* and 4*b* is exposed by the dummy pattern.

Figure 10:
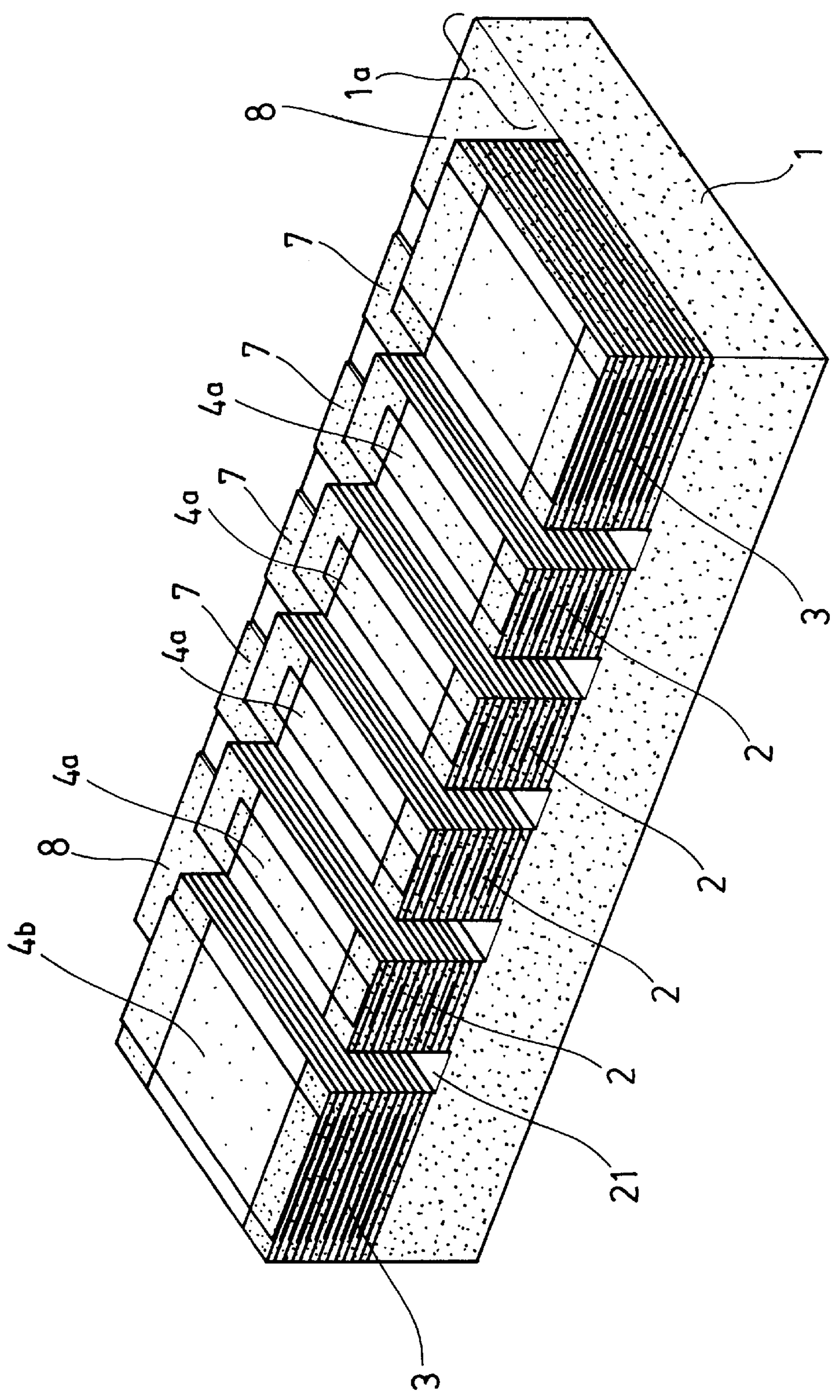
FIG. 10 is a perspective view of the laminated piezoelectric block provided with grooves in a process of the piezoelectric actuator manufacturing method of the present invention.

Referring to FIG. 10, longitudinal portions of a fixed width of the laminated piezoelectric block 20 between the adjacent first internal electrodes 4*a* and the end electrodes 4*b* are cut out to form longitudinal grooves in the laminated piezoelectric block 20. Those longitudinal portions may be cut by a known cutting means, such as grinding or wire-cutting. A cutting tool can properly be positioned opposite to the longitudinal portions by using the dummy pattern of the electrodes 4*a* and 4*b* exposed on the top surface of the laminated piezoelectric block 20 as a guide, so that the grooves can easily and accurately be formed. When the grooves are thus formed, the laminated piezoelectric block 20 is divided into the plurality of laminated piezoelectric elements 2 and the columns 3.

Formed in a width smaller than that of the laminated piezoelectric elements 2, the internal electrodes 4*a* and 5*a* are never exposed to the side surfaces of the laminated piezoelectric elements 2 formed by cutting the laminated piezoelectric block 20.

The grooves 21 dividing the laminated piezoelectric block 20 into the laminated piezoelectric elements 2 reaches the surface of the base 1 and divides a portion of the thin metal film 6 (FIG. 9) covering the electrode support surface la into the individual electrodes 7 and the common electrodes 8.

The top surface of each laminated piezoelectric element 2 is ground to remove the thin metal film 6, and the electrodes 4*a* and 4*b* forming the dummy pattern. The edge 1*b* between the electrode support surface 1*a* and the rear end surface of the base 1 is chamfered by grinding to remove a portion of the thin metal film 6 covering a portion of the surface of the base 1 around the edge 1*b* shown as FIG. 1. Consequently, an arrangement of the separate individual electrodes 7 and the common electrodes 8 is formed on the electrode support surface 1*a*.

Each individual electrode 7 is connected electrically through a portion of the thin metal film 6 formed on the back end surface 2*b* of the corresponding laminated piezoelectric element 2 to the second internal electrodes 5*a,* and the common electrode 8 is connected electrically through portions of the thin metal film 6 formed on the side surfaces and the front surface of the base 1 and the front surfaces 2*a* of the laminated piezoelectric elements 2 to the first internal electrodes 4*a*.

The present invention is not limited in its practical application to the foregoing embodiments specifically described above.

CAPABILITY OF EXPLOITATION IN INDUSTRY

The present invention is applicable to driving the ink-jet print heads of various ink-jet printer.

What is claimed is:

1. A piezoelectric actuator for an ink-jet head comprising:

a plurality of laminated piezoelectric elements each formed by alternately laminating first piezoelectric layers and second piezoelectric layers having the shape of a thin plate, and mounted and transversely arranged at fixed intervals on a base;

first internal electrodes each formed on a flat surface of each first piezoelectric layer so as to be exposed to only one of the two opposite longitudinal ends of the piezoelectric elements;

second internal electrodes each formed on a flat surface of each second piezoelectric layer so as to be exposed to only the other one of the two opposite longitudinal ends of the piezoelectric elements;

common electrodes formed on the base;

a collective conductive means consisting of a thin metal film electrically connecting the common electrodes to the exposed ends of the first internal electrodes of the laminated piezoelectric elements;

individual electrodes formed on the base, the number of which being equal to that of the laminated piezoelectric elements; and an individual conductive means electrically connecting each of the individual electrodes to the exposed ends of the second internal electrodes of each laminated piezoelectric element, wherein the common electrodes and the individual electrodes are formed on the same surface of the base, and wherein the collective conductive means consisting of a thin metal film is continuously formed on the surface of the base and one of the end surfaces of each laminated piezoelectric element so as to be connected to the common electrodes; and the individual conductive means is a portion of a thin metal film formed continuously on the other end surface of each piezoelectric element so at to be connected to the individual electrodes.

2. The piezoelectric actuator for an ink-jet head according to claim 1, wherein columns of a height equal to that of the laminated piezoelectric elements are disposed on the respective opposite transverse sides of the arrangement of the laminated piezoelectric elements mounted on the base.

3. A method of manufacturing a piezoelectric actuator for an ink-jet head including a base, a plurality of laminated piezoelectric elements mounted and transversely arranged at fixed intervals on the base, the base having an electrode support surface on its surface on which the laminated piezoelectric elements are arranged, said method comprising the steps of:

forming a plurality of internal electrodes each having a width less than that of the stacked substrate of piezoelectric elements to be formed on a surface of each of first piezoelectric substrates with their center axes aligned with those of the stacked substrate of piezoelectric elements to be formed so that only one of the end edges of each internal electrode reaches the longitudinal end edge of the first piezoelectric substrate;

forming a plurality of internal electrodes each having a width less than that of the stacked substrate of piezoelectric elements to be formed on a surface of each of second piezoelectric substrates with their center axes aligned with those of the stacked substrate of piezoelectric elements to be formed so that only one of the end edges of each internal electrode reaches the longitudinal end edge of the second piezoelectric substrate;

forming a stacked substrate of piezoelectric block by alternately stacking the first and the second piezoelectric substrates;

bonding the stacked substrate of piezoelectric block to the base at a predetermined position;

forming a thin metal film over the surfaces of the base and the stacked substrate of piezoelectric block; and cutting out longitudinal portions of a fixed width of the stacked substrate of piezoelectric block between the adjacent internal electrodes to form the plurality of stacked substrate of piezoelectric elements, dividing a portion of the thin metal film formed on an electrode support surface on the base into a common electrode electrically connected to portions of the thin metal film formed on one of longitudinal end surfaces of each stacked substrate of piezoelectric elements and a plurality of individual electrodes electrically connected to portions of the thin metal film formed on the other longitudinal end surfaces of the respective stacked substrate of piezoelectric elements, the common electrode and the individual electrodes being arranged transversely in the electrode forming region on the base.

4. The method of manufacturing a piezoelectric actuator for an ink-jet head according to claim 3, wherein, when forming the thin metal film on the surfaces of the base and the laminated piezoelectric block, a region in which the metal thin film is not formed is left in the surface of the laminated piezoelectric block so that at least a portion of the internal electrode formed on the top surface of the laminated piezoelectric block is exposed.

* * * * *